United States Patent
Lin et al.

(10) Patent No.: US 9,893,164 B2
(45) Date of Patent: Feb. 13, 2018

(54) BIPOLAR TRANSISTOR DEVICE FABRICATION METHODS

(71) Applicants: Xin Lin, Phoenix, AZ (US); Daniel J Blomberg, Chandler, AZ (US); Jiang-Kai Zuo, Chandler, AZ (US)

(72) Inventors: Xin Lin, Phoenix, AZ (US); Daniel J Blomberg, Chandler, AZ (US); Jiang-Kai Zuo, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 133 days.

(21) Appl. No.: 14/844,608

(22) Filed: Sep. 3, 2015

(65) Prior Publication Data

US 2015/0380513 A1     Dec. 31, 2015

Related U.S. Application Data

(62) Division of application No. 14/047,222, filed on Oct. 7, 2013, now Pat. No. 9,130,006.

(51) Int. Cl.
*H02H 9/04* (2006.01)
*H01L 21/331* (2006.01)
(Continued)

(52) U.S. Cl.
CPC ........ *H01L 29/6625* (2013.01); *H01L 21/266* (2013.01); *H01L 21/26513* (2013.01); *H01L 21/76224* (2013.01); *H01L 29/0649* (2013.01); *H01L 29/08* (2013.01); *H01L 29/1008* (2013.01); *H01L 29/735* (2013.01); *H01L 29/0808* (2013.01); *H01L 29/0821* (2013.01)

(58) Field of Classification Search
CPC ............. H01L 29/7835; H01L 29/1083; H01L 29/0821; H01L 29/1004; H01L 29/7322; H01L 29/7833; H01L 29/063; H01L 29/872; H01L 21/761; H01L 21/8249; H01L 29/0634; H01L 29/7816; H01L 29/66234; H01L 29/6625; H01L 29/735; H01L 21/82
USPC .................................................. 257/520–530
See application file for complete search history.

(56) References Cited

U.S. PATENT DOCUMENTS 5,389,561 A      2/1995   Gomi
5,847,440 A *  12/1998   Yamamoto .......... H01L 21/8222
                                                                257/525
(Continued)

*Primary Examiner* — Marcos D Pizarro
*Assistant Examiner* — Nelson Garces
(74) *Attorney, Agent, or Firm* — Rajeev Madnawat

(57) ABSTRACT

A method of fabricating a bipolar transistor device includes performing a first plurality of implantation procedures to implant dopant of a first conductivity type to form emitter and collector regions laterally spaced from one another in a semiconductor substrate, and performing a second plurality of implantation procedures to implant dopant of a second conductivity type in the semiconductor substrate to form a composite base region. The composite base region includes a base contact region, a buried region through which a buried conduction path between the emitter and collector regions is formed during operation, and a base link region electrically connecting the base contact region and the buried region. The base link region has a dopant concentration level higher than the buried region and is disposed laterally between the emitter and collector regions.

20 Claims, 3 Drawing Sheets

(51) Int. Cl.
  *H01L 29/73* (2006.01)
  *H01L 27/02* (2006.01)
  *H01L 29/66* (2006.01)
  *H01L 29/735* (2006.01)
  *H01L 21/265* (2006.01)
  *H01L 21/266* (2006.01)
  *H01L 21/762* (2006.01)
  *H01L 29/06* (2006.01)
  *H01L 29/10* (2006.01)
  *H01L 29/08* (2006.01)

(56) References Cited

U.S. PATENT DOCUMENTS

| | | | |
|---|---|---|---|
| 6,953,981 B1* | 10/2005 | Johansson | H01L 23/535 257/503 |
| 8,188,568 B2* | 5/2012 | Imahashi | H01L 27/0259 257/173 |
| 2005/0110111 A1* | 5/2005 | Horn | H01L 27/0623 257/526 |
| 2007/0205487 A1 | 9/2007 | Ikeda | |
| 2011/0176244 A1 | 7/2011 | Gendron et al. | |
| 2012/0098096 A1* | 4/2012 | Lin | H01L 29/6625 257/565 |
| 2012/0295414 A1 | 11/2012 | Zhan et al. | |
| 2013/0099280 A1* | 4/2013 | Coyne | H01L 27/0262 257/170 |
| 2014/0054747 A1* | 2/2014 | Lin | H01L 29/6625 257/565 |
| 2014/0346563 A1* | 11/2014 | Salcedo | H01L 27/0262 257/173 |

* cited by examiner

BIPOLAR TRANSISTOR DEVICE FABRICATION METHODS

CROSS-REFERENCE TO RELATED APPLICATION

This application is a divisional application of U.S. application Ser. No. 14/047,222, entitled "Semiconductor Device with Buried Conduction Path" and filed Oct. 7, 2013, the entire disclosure of which is hereby incorporated by reference.

FIELD OF INVENTION

The present embodiments relate to semiconductor devices.

BACKGROUND

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Power transistor devices are designed to be tolerant of the high currents and voltages that are present in power applications such as motion control, air bag deployment, and automotive fuel injector drivers. One type of power transistor is a laterally diffused metal-oxide-semiconductor (LDMOS) transistor. Power transistor devices may have a number of features customized to prevent breakdown resulting from the high electric fields arising from such high voltages.

Power transistor devices are often combined in ICs with low voltage FET transistor devices. The low voltage devices provide logic or analog functionality to support the operation of the high voltage devices.

The fabrication process flow is thus configured with a considerable number of dopant implantation and other procedures directed to creating features specific to the high voltage FET devices and the low voltage FET devices. The procedures may be highly customized to optimize the features of the high and low voltage devices. The customization of the procedures may not be conducive to fabricating conventional designs of other semiconductor devices, such as bipolar transistors, in the same process flow. The customization of the procedures may also result in expenses that leave little, if any, resources for implementing procedures customized for fabricating such other semiconductor devices.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
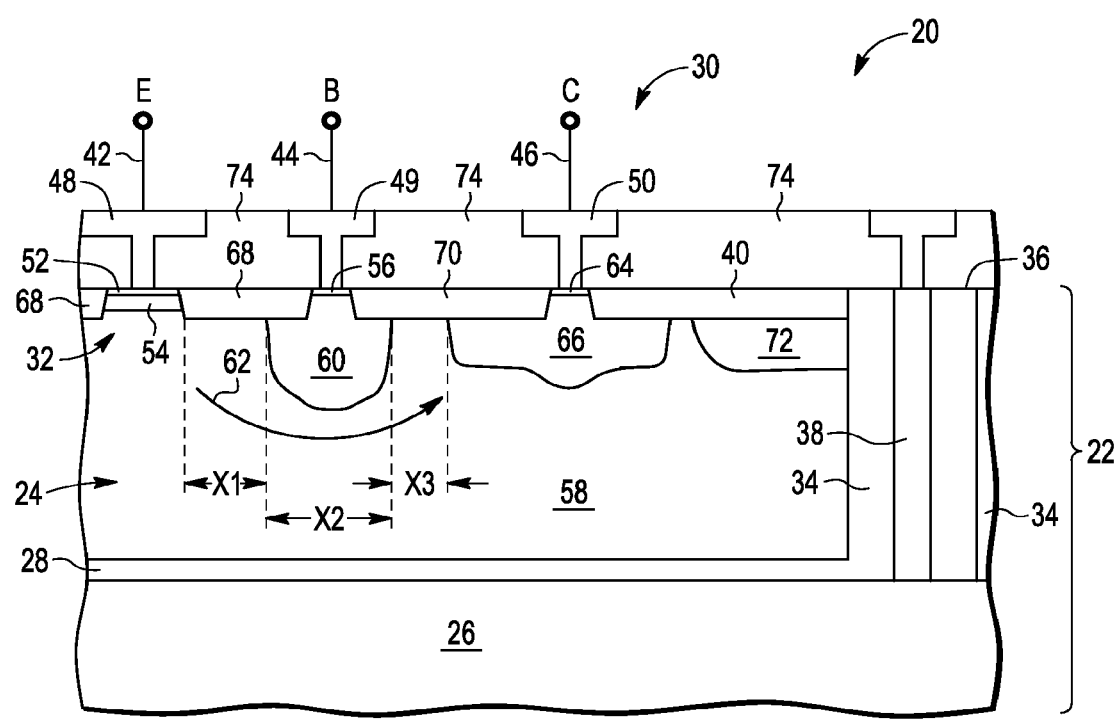
FIG. 1 is a cross-sectional, schematic view of an exemplary bipolar transistor device having a buried conduction path in accordance with one embodiment.

Semiconductor devices having a buried conduction path are described. Methods of fabricating such devices are also described. The semiconductor devices may be lateral bipolar transistor devices having a composite base region disposed laterally between emitter and collector regions. The composite base region may include a base link region electrically connecting a base contact region with a buried region through which a buried conduction path between the emitter and collector regions is formed during operation.

The emitter and collector regions may be contiguously surrounded by the buried region of the composite base region. The emitter and collector regions may be separated by the base link region, which may be highly doped (e.g., a dopant concentration level between the base contact region and the buried region). The buried region of the composite base region may be lightly doped, which may give rise to a high current gain for the bipolar transistor device. The base link region may be deeper than both the emitter and collector regions. The buried conduction path may be defined between the base link region and a buried insulator layer of a semiconductor substrate, such as a semiconductor-on-insulator substrate. The buried conduction path may position the majority of charge carriers away from the surface of the substrate to avoid issues that may arise from charge trapping at the surface, such as at an interface with a shallow trench isolation (STI) region.

The design of the disclosed devices may lead to improvements in gain. The isolation provided by the buried insulator layer and, for instance, a deep trench isolation (DTI) region, may lead to an increased number of the injected charges being collected by the collector region. Unlike other lateral bipolar transistor designs, the current gain of the disclosed bipolar transistor devices is not inversely proportional to the spacing between the emitter and collector regions. Instead, the current gain of the disclosed devices is predominantly a function of, or substantially based on, the lateral spacing between the emitter region and the base link region. The lateral spacing between the emitter region and the base link region may be used to control the amount of current injected from the emitter region into the base region. When the spacing between the emitter region and the base link region increases, more charge carriers are injected into the base region along different current paths, i.e., along different directions. When the spacing is decreased, less charge carriers are injected into the base region, as carrier injection occurs primarily in a vertical direction.

The buried conduction path decouples the gain and the Early voltage of the disclosed devices. The Early voltage is a measure of the Early effect, which reflects the modulation of the base width arising from variation in the base-collector voltage. A higher Early voltage is indicative of device performance closer to an ideal transistor with zero output conductance. The Early voltage of the disclosed devices, i.e., for a particular lateral spacing between the emitter and the base link regions and a particular width of the base link region, may be improved by increasing the spacing between the collector region and the base link region. The improved Early voltage may be achieved without a decrease in current gain. The disclosed devices may also exhibit an improved breakdown voltage level, e.g., BVceo, insofar as the deep base link region may prevent punch-through between the emitter and collector regions.

The base, emitter, and other regions of the lateral bipolar transistor devices described herein may be configured via one or more implantation procedures directed to fabricating one or more field effect transistor (FET) devices. The disclosed devices may thus be fabricated using a process flow for fabricating FET devices, such as power MOSFET, analog MOSFET, and/or logic MOSFET devices. The fabrication of the disclosed devices may thus avoid adding implants, mask, or other fabrication steps to an existing process flow. Process steps dedicated to the fabrication of the bipolar transistor devices are not added despite the optimization of the steps of the existing process flow for the power, analog, and/or logic FET devices.

The use of existing implantation procedures allows the bipolar transistor devices to be fabricated cost effectively. The bipolar transistor devices may be useful in analog, power, and system-on-a-chip and other technologies. The bipolar transistor devices exhibit acceptable performance for these and other applications despite the optimization of the implantation procedures for MOSFET devices.

Although described below in connection with a silicon-on-insulator (SOI) substrate, the disclosed devices and fabrication methods may be used with other substrate types and fabrication technologies. The manner in which the disclosed devices are isolated from neighboring devices or the semiconductor substrate may also vary. The configuration, depth, construction, materials and other characteristics of isolation regions may vary. For instance, the disclosed devices and methods are not limited to device arrangements having shallow trench isolation (STI) regions for intra-device isolation or deep trench isolation (DTI) regions for inter-device isolation.

Although described below in connection with npn bipolar transistor devices, the disclosed devices are not limited to any particular bipolar transistor configuration. P-type base bipolar transistor devices are described and illustrated herein for convenience of description and without any intended limitation. However, pnp devices may be provided by, for example, substitution of semiconductor regions of opposite conductivity type. Thus, for example, each semiconductor region, layer or other structure in the examples described below may have a conductivity type, e.g., n-type or p-type, opposite to the type identified in the examples below.

FIG. 1 is a schematic cross-sectional view of an example of an npn bipolar transistor device 20 constructed in accordance with one embodiment. The device 20 includes a semiconductor substrate 22, which may, in turn, include a number of epitaxial layers 24. In this example, the semiconductor substrate 22 includes a p-type epitaxial layer grown above an original substrate 26. The original substrate 26 may include a lightly or heavily doped n-type or p-type substrate, e.g., a handle wafer, and may include one or more epitaxial layers. In this example, a lightly doped n-type substrate may be used. The device 20 may alternatively or additionally include non-epitaxial layers in which one or more device regions are formed. Any one or more of the layers of the semiconductor substrate 22 may include silicon. Other semiconductor materials may be used, including both elementary and compound semiconductor materials.

In this example, the semiconductor substrate 22 has an SOI construction having a buried insulator layer 28. The buried insulator layer 28 may include, for example, a silicon oxide, e.g., $SiO_2$, layer having a thickness of about 0.3 µm, but other thicknesses, materials, and layers may be used. The epitaxial layer 24 may be grown via conventional SOI techniques involving, for instance, a seed layer disposed on the buried insulator layer 28.

The structural, material, and other characteristics of the semiconductor substrate 22 may vary from the example shown. For example, the semiconductor substrate 22 may include a non-epitaxial semiconductor layer disposed on the buried insulating layer 28. Additional, fewer, or alternative layers may be included in the semiconductor substrate 22. Any number of additional semiconductor and/or non-semiconductor layers may be included. For example, a buried device isolating layer may be disposed on the original substrate 26 or the buried insulator layer 28. The disclosed devices are thus not limited to, for instance, SOI or bulk substrates, or substrates including epitaxially grown layers, and instead may be supported by a wide variety of other types of semiconductor substrates.

A portion of a device area 30 is depicted in FIG. 1. The device area 30 may include a portion that mirrors the depicted portion. In this example, the device area 30 may be laterally symmetrical about a central emitter active area 32. In other embodiments, the device 20 is symmetrical about other device active areas or not symmetrical. The device area 30 may be defined by one or more isolation trenches or regions 34. In this example, the isolation trenches 34 are configured as DTI regions that extend from a surface 36 of the semiconductor substrate 22 to the original substrate 26 or the buried insulator layer 28 to define a lateral periphery of the device 20. One or more of the isolation trenches 34 may be contiguous with the insulating layer 28 as shown. The device area 30 may also be defined by one or more doped isolating layers or regions 38 in the epitaxial layer 24. In this example, the doped isolating layers or regions 38 are configured as an n-type or p-type isolation ring that extends through the epitaxial layer 24 and past the insulating layer 28 to reach the original substrate 26. Alternatively, the regions 38 are made of polysilicon. The isolation trenches 34 and the doped isolating region 38 may thus laterally and/or otherwise surround the device area 30. These layers or regions act as a barrier separating the device area 30 from the rest of the substrate 22 or the original substrate 26.

In this example, the buried insulator layer 28 extends laterally across, e.g., under, the device area 30 of the device 20 to act as a vertical barrier separating the device area 30 from the original substrate 26 and other neighboring devices. In this embodiment, the doped isolating layer 38 along the perimeter of the device area 30 is configured as a substrate tie used to bias the original substrate 26. The device 20 may include any number of doped or non-doped isolating regions surrounding the device area 30.

The lateral extent of the device area 30 may also be defined by one or more additional trench isolation regions. In this example, the device area 30 is further defined by a shallow trench isolation (STI) region 40 disposed at the surface 36 of the semiconductor substrate 22. In this example, the surface 36 corresponds with an upper surface of the epitaxial layer 24. The STI region 40 may be ring-shaped. In this example, the STI region 40 is disposed adjacent an inner one of the DTI regions 34. The STI region 40 may be used to provide further separation between the substrate tie and the active areas of the device 20. The trench of the STI region 40 may be filled with silicon oxide and/or other materials.

The device 20 includes an emitter terminal 42, a base terminal 44, and a collector terminal 46 supported by the semiconductor substrate 22. The terminals 42, 44, 46 are spaced from one another along the surface 36. Metal contacts and/or interconnects 48-50 are provided for electrically connecting each terminal 42, 44, 46 to respective regions in the semiconductor substrate 22. The metal contacts and/or interconnects 48-50 may be formed with any one or more metal or conductive material using any deposition procedure.

The respective regions in the semiconductor substrate 22 for the emitter, base, and collector terminals 42, 44, 46 may be configured as composite regions having a number of constituent regions. In this example, the constituent regions are disposed in the epitaxial layer 24 or other semiconductor layer of the semiconductor substrate 22 that defines the surface 36. The constituent regions may be formed with respective implantation procedures, as described below. Each composite region includes a respective contact region disposed in the semiconductor substrate 22 at the surface 36. The dopant concentration of each contact region may be at a level sufficient to establish a respective ohmic contact for one of the device terminals. Each contact region may be contiguous with respective further constituent emitter, base, and collector regions disposed in the semiconductor substrate 22. In other cases, one of the device terminals may not connect to a composite region. For example, the emitter may include only a contact region in some embodiments.

In the embodiment of FIG. 1, the device 20 includes a composite emitter region. The composite emitter region includes an emitter contact region 52 and an emitter extension region 54 adjacent the emitter contact region 52. The emitter extension region 54 extends deeper into the semiconductor substrate 22 than the emitter contact region 52. In this example, the constituent emitter regions are n-type regions stacked upon one another and having a similar lateral extent. The emitter region may include fewer, additional, or alternative regions than shown in FIG. 1. For example, the emitter region may include a well region in which the emitter contact region 52 is disposed, or in which both the emitter contact region 52 and the emitter extension region 54 are disposed. The emitter region may alternatively include only the emitter contact region 52, i.e., without an extension region or well region. Another example of an alternative composite emitter region is provided in connection with the embodiment shown and described in connection with FIG. 2.

The device 20 has a composite base region that includes a base contact region 56, a buried region 58, and a base link region 60. The base contact region 56 and the buried region 58 are electrically connected by the base link region 60. As described below, a buried conduction path 62 is formed in the buried region 58 during operation of the device 20. In this example, the constituent base regions are p-type regions. The base link region 60 may be configured as a well region on or in which the base contact region 56 is disposed. In this example, the base contact region 56 is laterally centered within the well of the base link region 60. The relative positioning of the base contact region 56 and the base link region 60 may vary from the example shown. For example, the base link region 60 may not extend laterally beyond the base contact region 56.

The buried region 58 may be defined by the portion of the epitaxial layer 24 between the base link region 60 and the buried insulator layer 28. The buried region 58 may correspond with the portions of the epitaxial layer 24 not doped, e.g., by implantation procedures, to form other regions of the device 20. The buried region 58 may thus have the same conductivity type as the epitaxial layer 24, e.g., p-type. Alternatively or additionally, the buried region 58 includes one or more regions formed and/or defined by one or more implantation procedures rather than solely by the absence or lack of n-type or p-type implanted dopants, such as in embodiments not having an epitaxial layer.

The isolation of the epitaxial layer 24 by the buried insulator layer 28 and the DTI region(s) 34 allows the base link region 60 to be placed between the emitter and collector regions to force the charge carriers to flow through the portion of the epitaxial layer 24 that corresponds with the buried region 58. The manner in which the isolation is provided in the embodiment of FIG. 1, e.g., by an SOI substrate and a DTI ring, may eliminate or reduce parasitic components often introduced by other, junction-based isolation techniques.

The composite base region may include additional or alternative regions. For example, multiple base link regions may be provided to further define the buried conduction path 62. Alternatively or additionally, the arrangement of the constituent regions of the composite base region may vary from the example shown in FIG. 1. An example of an alternative arrangement is shown and described in connection with FIG. 2.

The device 20 includes a composite collector region. In this embodiment, the composite collector region includes a collector contact region 64 and a collector well region 66 in or on which the collector contact region 64 is disposed. The collector contact region 64 may be laterally centered within the collector well region 66. The composite collector region may include additional or alternative constituent regions. For example, multiple collector well regions may be provided. Alternatively or additionally, the constituent regions of the composite collector region may be arranged differently from the example shown in FIG. 1. For example, the collector contact region 64 may not be centered within the collector well region 66.

The contact regions 52, 56, 64 are laterally spaced from one another along the surface 36 of the semiconductor substrate 22. The base contact region 56 is disposed laterally between the emitter and collector regions 52 and 64. An STI region 68 is disposed between the emitter contact region 52 and the base contact region 56. Another STI region 70 is disposed between the base contact region 56 and the collector contact region 64. The STI regions 68, 70 may be configured similarly to the STI region 40. The STI region 68 may define boundaries of the emitter active area 32. The STI regions 68 and 70 may define boundaries of the base active area, which may be ring-shaped. The STI regions 40, 70 may define boundaries of the collector active area, which may also be ring-shaped. Further STI regions may be provided to isolate or separate other contact regions.

During operation, charge carriers flow between the emitter and collector terminals 42, 46 primarily through the buried region 58 along the buried conduction path 62. The buried region 58 contiguously surrounds the emitter extension region 54 and the collector well region 66. Charge carriers are thus injected from the emitter terminal into the buried region 58, and thus flow through the buried region 58 to reach the collector well region 66.

The buried region 58 may provide the primary current conduction path for the device 20 due to the presence of the more heavily doped base link region 60. The base link region 60 is disposed laterally between the above-described emitter and collector regions. The base link region 60 may have a dopant concentration level considerably higher than the buried region 58. The higher dopant concentration level leads to relatively greater recombination rates within the base link region 60 than in the buried region 58. With the greater recombination rates in the base link region 60, the charge carriers that reach the collector well region 66 primarily follow the buried conduction path 62 through the buried region 58.

The dopant concentration level of the base link region 60 may fall between the dopant concentration levels of the base contact region 56 and the buried region 58. For example, the base link region 60 may have a dopant concentration level about two to about four orders of magnitude lower than the base contact region 56. The base link region 60 may have a dopant concentration level about two to about four orders of magnitude higher than the buried region 58.

The buried region 58 may be lightly doped. In this embodiment, the buried region 58 has a dopant concentration level that corresponds with the dopant concentration level of the epitaxial layer 24. With the conduction path 62 disposed in the buried region 58, the low dopant concentration level of the buried region 58 may establish a high gain for the device 20.

The size of the buried conduction path 62 is determined by the distance between the base link region 60 and the buried insulating layer 28. The buried conduction path 62 may thus be defined by the positioning, shape, size, and other characteristics of the base link region 60. The buried conduction path 62 may thus be optimized through adjustments to the thickness of the epitaxial layer 24.

The gain of the device 20 is largely a function of a lateral spacing X1 between the base link region 60 and the emitter region, e.g., the emitter extension region 54. The gain of the device 20 is thus not dependent upon the spacing between the emitter and collector regions. In a traditional lateral bipolar transistor design, the gain is inversely proportional to the emitter-collector spacing. As the spacing X1 increases, the current gain of the device 20 increases. The increased gain primarily arises from more charge carriers being injected into the base region along different directions. The base current may only slightly increase as the spacing increases due to a low dopant concentration of the base region 58. As a result, the current gain, i.e., the ratio of collector current to base current, is improved, as the collector current is approximately equal to the emitter current.

The base link region 60 has a deeper lower boundary than the composite emitter and collector regions. In the embodiment of FIG. 1, the lower boundary of the base link region 60 is deeper than the lower boundary of the emitter extension region 54 and is deeper than the lower boundary of the collector well region 66.

The relative depth of the base link region 60 may lead to charge carriers being injected more vertically from the emitter extension region 54. On the collector side, the relative depth of the base link region 60 may lead to a more vertical conduction path as the charge carriers reach the collector well region 66.

A decrease in the spacing X1 may cause charge carriers to be injected from the emitter extension region 54 more vertically along the buried conduction path 62. An increasingly vertical orientation of the conduction path 62 may lead to improvements in the Early voltage, albeit at the expense of decreased gain.

Improvements in the Early voltage may also be achieved by adjusting a width X2 of the base link region 60 and a spacing X3 between the base link region 60 and the collector well region 66. As the base width X2 increases, the Early voltage may increase without much effect on gain or breakdown voltage. The Early voltage may also be increased by increasing the base-collector spacing X3. The conduction path 62 becomes longer as the base width X2 and/or the spacing X3 between the base link region 60 and the collector well region 66 increases. The depletion of the collector well region 66 may thus have less impact on the conduction path, and the device 20 may be less sensitive to the voltage at the collector terminal 46. Thus, unlike the adjustments to the emitter-base spacing X1, increasing the base width X2 and the base-collector spacing X3 may not result in appreciable decreases in gain. The size, e.g., depth and width, of the base link region 60 and the positioning of the collector well region 66 may thus be used to achieve a desired Early voltage for the device 20 without sacrificing gain.

The configuration and positioning of the base link region 60 relative to the collector well region 66 may be used to decouple the gain and Early voltage of the device 20. A desired gain may be achieved via selection of an emitter-base spacing X1. Given that emitter-base spacing X1, a desired Early voltage level may then be achieved by adjusting the base width X2 and/or the base-collector spacing X3. The previously established gain level remains largely unchanged.

The base link region 60 may also lead to improved punchthrough or breakdown characteristics for the device 20. The depth of the base link region 60 may help to prevent punchthrough between the above-described emitter and collector regions. The device 20 may be configured such that the breakdown voltage BVceo between the emitter and the collector terminals, and with the base terminal floating, instead occurs at or near the collector contact region 64. The breakdown voltage BVcbo between the base and collector terminals, and with the emitter terminal floating, is determined by the spacing between the base link region 60 and the collector well region 66.

The buried nature of the conduction path 62 may also provide advantages. The conduction path 62 may be disposed at a depth sufficient to avoid complications that may otherwise arise from surface charge trapping. The vertical components of the buried conduction path 62 at both the emitter and collector sides space the charge carriers from the STI regions at the surface 36. Charge carriers flowing along the buried conduction path 62 may thus be sufficiently buried throughout the lateral extent of the composite base region to thereby avoid charge trapping at the surface 36. Issues relating to charge trapping in purely lateral bipolar transistor devices may thus be avoided.

In the embodiment of FIG. 1, the device 20 includes a peripheral well region 72 configured to disrupt a parasitic BJT conduction path between the above-described emitter and collector regions along the buried oxide layer 28. In this embodiment, the peripheral well region 72 is configured as a p-type well disposed at the surface 36 between the innermost DTI region 34 and the collector well region 66. Charge carriers that may be encouraged to travel through thin inverted or depleted layers located along the buried oxide layer 28 and the DTI region 34 are thus blocked from reaching the collector terminal 46. The inverted or depleted layers may be present when the original substrate 26 is grounded.

The device 20 may include a number of passivation layers or structures 74 supported by the semiconductor substrate 22. Each passivation structure 74 is formed on or otherwise above the surface 36 to isolate adjacent electrodes of the device 20. Each passivation structure 74 may include one or more insulating materials, such as silicon oxide and/or silicon nitride. The materials, configuration, construction, and other characteristics of the passivation structures 74 may vary from the example shown.

The device 20 is shown in simplified form and, thus, FIG. 1 does not show a number of metal layers configured for electric coupling with the emitter, base, and collector terminals 42, 44, and 46 and other device structures. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be disposed between the original substrate 26 and the device area 30. One or more further STI regions, other isolation trenches, and/or isolation wells (not shown) may be provided to isolate the device area 30 and/or other region of the device 20.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| epitaxial 24: | $1\text{-}2 \times 10^{15}/\text{cm}^3$ | 5 μm |
| substrate 26: | $2 \times 10^{15}/\text{cm}^3$ | not applicable |
| contact 52: | $2 \times 10^{21}/\text{cm}^3$ | 0.2 μm |
| extension region 54: | $5 \times 10^{18}/\text{cm}^3$ | 0.25 μm |
| contact 56: | $2 \times 10^{21}/\text{cm}^3$ | 0.2 μm |
| buried region 58: | $1\text{-}2 \times 10^{15}/\text{cm}^3$ | 5 μm |
| link region 60: | $1 \times 10^{18}/\text{cm}^3$ | 3.5 μm |
| contact 64: | $2 \times 10^{21}/\text{cm}^3$ | 0.2 μm |
| well region 66: | $5 \times 10^{16}/\text{cm}^3$ | 1.7 μm |
| well region 74: | $1 \times 10^{17}/\text{cm}^3$ | 1.4 μm |

The concentrations and thicknesses may be different in other embodiments. For example, the dopant concentration of the original substrate 26 may vary considerably.

In some embodiments, one or more doped regions of the device 20 are formed with existing dopant implantation procedures associated with the fabrication of one or more regions of FET device designs supported by the process flow. For example, the existing implantation procedures may be directed to fabricating a high voltage or power FET device, e.g., an LDMOS device, a high or low voltage analog FET device, or a low voltage or logic FET device. The dopant concentration, ion energy, implant angle, and/or other characteristics of the implants may thus vary in accordance with the parameters established by the FET device design(s). Each of the above-described composite emitter, base, and collector regions may be formed via a respective combination of multiple implantation procedures. For example, the combination of procedures may be configured to establish the above-described contact region and any other buried, well, or other region of the respective composite region.

In other embodiments, one or more implantation masks may be used that do not correspond with an existing mask or implantation procedure. The disclosed devices are thus not limited to designs in which each feature is fabricated via an implant used to fabricate a FET device. The disclosed devices are also not limited to designs in which the dopant for each region (or section thereof) is provided via an implantation procedure. In this example, a primary portion or main body of the composite base region, e.g., the buried region 58, may be doped during the growth of the p-type epitaxial layer 24. Fewer, additional, or alternative regions or sections thereof may be formed in this manner.

In the embodiment of FIG. 1, existing dopant implantation procedures associated with the fabrication of multiple FET device designs may be used to form each doped region other than the buried region 58, which corresponds with the epitaxial layer 24. The emitter, base, and collector contact regions 52, 56, 64 may be formed by n-type or p-type FET terminal, e.g., source/drain, implantation procedures.

The emitter extension region 54 may be formed by a power FET terminal extension implantation procedure configured to form a lightly or moderately doped region, such as a lightly doped drain (LDD) region of a power FET device. In the example of FIG. 1, the power FET terminal extension implantation procedure may thus be an n-type LDD (NLDD) implant.

The base link region 60 may be formed with an implantation procedure configured to form a well region of a logic or other low voltage FET device. In the example of FIG. 1, the well region may correspond with a p-type body or other region of an n-type low voltage FET device.

The collector well region 66 may be formed with an implantation procedure configured to form a well region of a power FET device, such as an LDMOS transistor device. The well region may be configured for use as an accumulation or drift region of the power FET device. In the example of FIG. 1, the implantation procedure may be directed implant n-type dopant to compensate for the p-type doping of the epitaxial layer 24 to form an n-type accumulation region. The dopant concentration level achieved by the compensation implantation procedure may be configured to support a dopant concentration at least on the same order of magnitude as the epitaxial layer 24. The dopant concentration level may fall in a range from about $5 \times 10^{15}/\text{cm}^3$ to about $1 \times 10^{17}/\text{cm}^3$. The compensation implantation procedure may also have an energy level configured for a shallow depth, which may be useful in forming the accumulation and/or drift region of an LDMOS transistor device.

The peripheral well region 72 may be formed by an implantation procedure configured to form a well region of a power FET device, such as an LDMOS transistor device or other high voltage transistor device. In LDMOS transistor devices, the well region may correspond with a drift region of the transistor device. In the example of FIG. 1, the implantation procedure may implant p-type dopant to form a drift region of a p-type LDMOS transistor device.

The same implant may be used to form multiple regions. For example, the compensation implantation procedure for the collector well region 66 may also be used to form a well region for the emitter terminal The emitter well region may be in addition to, or an alternative to, the emitter extension region 54. An example of the latter case is shown and described below in connection with FIG. 2.

The dopant ion energy levels for the above-described implantation procedures may vary. In one example of the embodiment shown in FIG. 1, the above-referenced implantation procedures may have the following approximate peak ion implant energies:

|  | Ion | Ion Energy | Angle |
| --- | --- | --- | --- |
| n-type source/drain: | As | 30 KeV | 0° |
| p-type source/drain: | B | 5 KeV | 0° |
| power FET NLDD: | P | 35 KeV | 0° |
| logic FET p-well: | B | 550 KeV | 0° |
| power FET n-comp: | P | 720 KeV | 1° |

Figure 2:
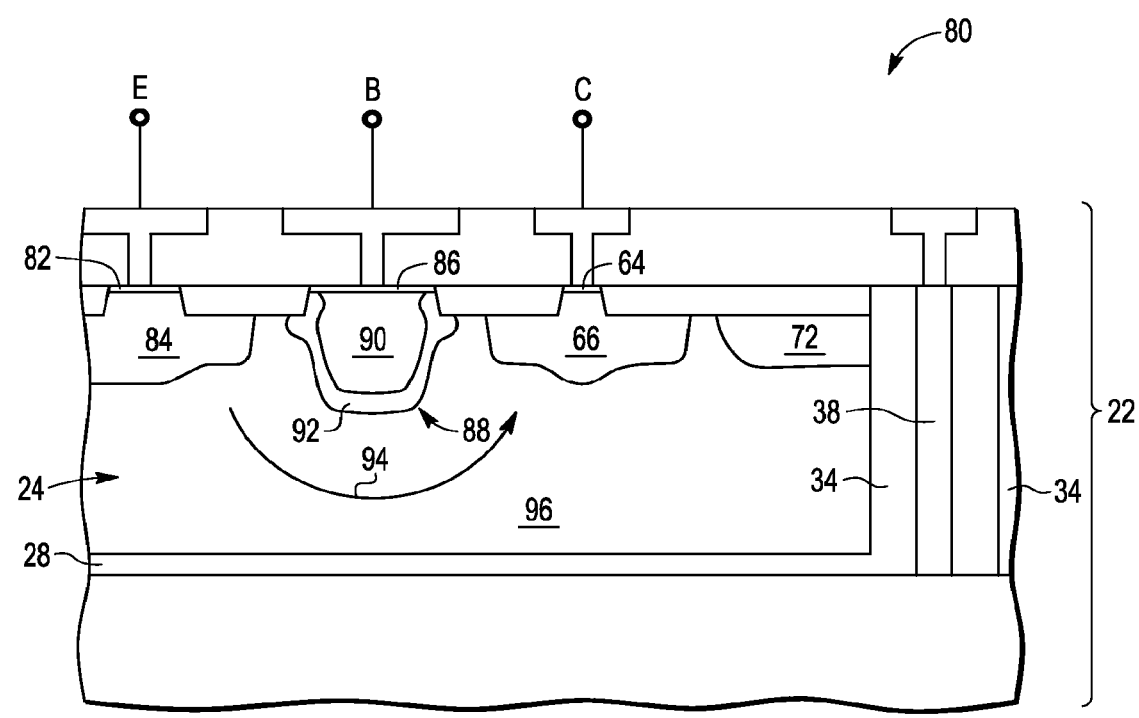
FIG. 2 is a cross-sectional, schematic view of another exemplary bipolar transistor device having a buried conduction path in accordance with one embodiment.

FIG. 2 shows another exemplary bipolar transistor device 80 fabricated and configured in accordance with one or more aspects of the disclosure. The device 80 has a lateral orientation with a number of regions and structures configured in a manner similar to the embodiments described above. For instance, the device 80 is formed in SOI substrate 22 with original substrate 26, buried insulator layer 28, epitaxial layer 24, and lateral isolation provided by DTI and other isolating regions 34 and 38, as described above. Structures of the device 80 supported by the SOI substrate 22 may also be configured similarly to the examples described in connection with FIG. 1. In this embodiment, the device 80 has a composite collector region configured similarly to the example of FIG. 1, with collector contact region 64 and collector well region 66. The above-described peripheral well region 72 may also be included.

The device 80 differs from the above-described embodiments in the configuration of the composite emitter and base regions. In this embodiment, the composite emitter region includes a contact region 82 disposed in or on an emitter well region 84. The emitter contact region 82 may be configured similarly to the emitter contact region 52 (FIG. 1). The emitter well region 84 may replace the emitter extension region 54 (FIG. 1). Alternatively, the composite emitter region includes both the emitter well region 84 and the emitter extension region 54. The emitter well region 84 may extend laterally beyond the emitter contact region 82. In this example, the emitter well region 84 establishes an emitter-base spacing of about one third of the distance between the emitter contact region 82 and a base contact region 86. Other distances for the emitter-base spacing may be used. The emitter well region 84 may be formed with the same implantation procedure, e.g., the n-type compensation implantation procedure, used to form the collector well region 66.

In the embodiment of FIG. 2, the base contact region 86 of the composite base region is wider than the base contact region 56 (FIG. 1). The width of the base contact region 86 may support an increased base width to improve the Early voltage as described above. However, in this example, the width of a base link region 90 is limited to avoid an excessive decrease in the gain of the device 80. The width of the base link region 90 is established by a mask used during the p-type logic FET well or other implantation procedure used to form the base link region 90. In this example, the mask has an opening that allows dopant to be implanted in an inner portion 90 of the base link region 88. The inner portion 90 is disposed within the lateral extent of the base contact region 86. Subsequent diffusion spreads the distribution of the dopant into an outer portion 92 of the base link region 88. The outer portion 92 has a lower dopant concentration level than the inner portion 90. Diffusion of the dopant in the inner portion 90 into the outer portion 92 may moderate the effects of the increase in emitter-base spacing, the decreased base width, and/or the increase in base-collector spacing.

During operation, a buried conduction path 94 is formed in a buried region 96 of the composite base region. The buried region 96 corresponds with a portion of the epitaxial layer 24 not doped by the above-described procedures. The buried region 96 contiguously surrounds the emitter well region 84 and the collector well region 66.

The configuration of the base link region 90 may vary. For example, the relative sizes of the inner and outer portions may vary from the example shown. In other cases, the base contact region and base link regions may be formed with a common mask opening. Alternatively, the base link region 90 may be formed with multiple implants with different mask openings.

The configurations of the other regions of the disclosed devices may also vary. For example, the emitter may be formed with a source/drain implantation procedure alone. The emitter may thus not be configured as a composite emitter region.

Figure 3:
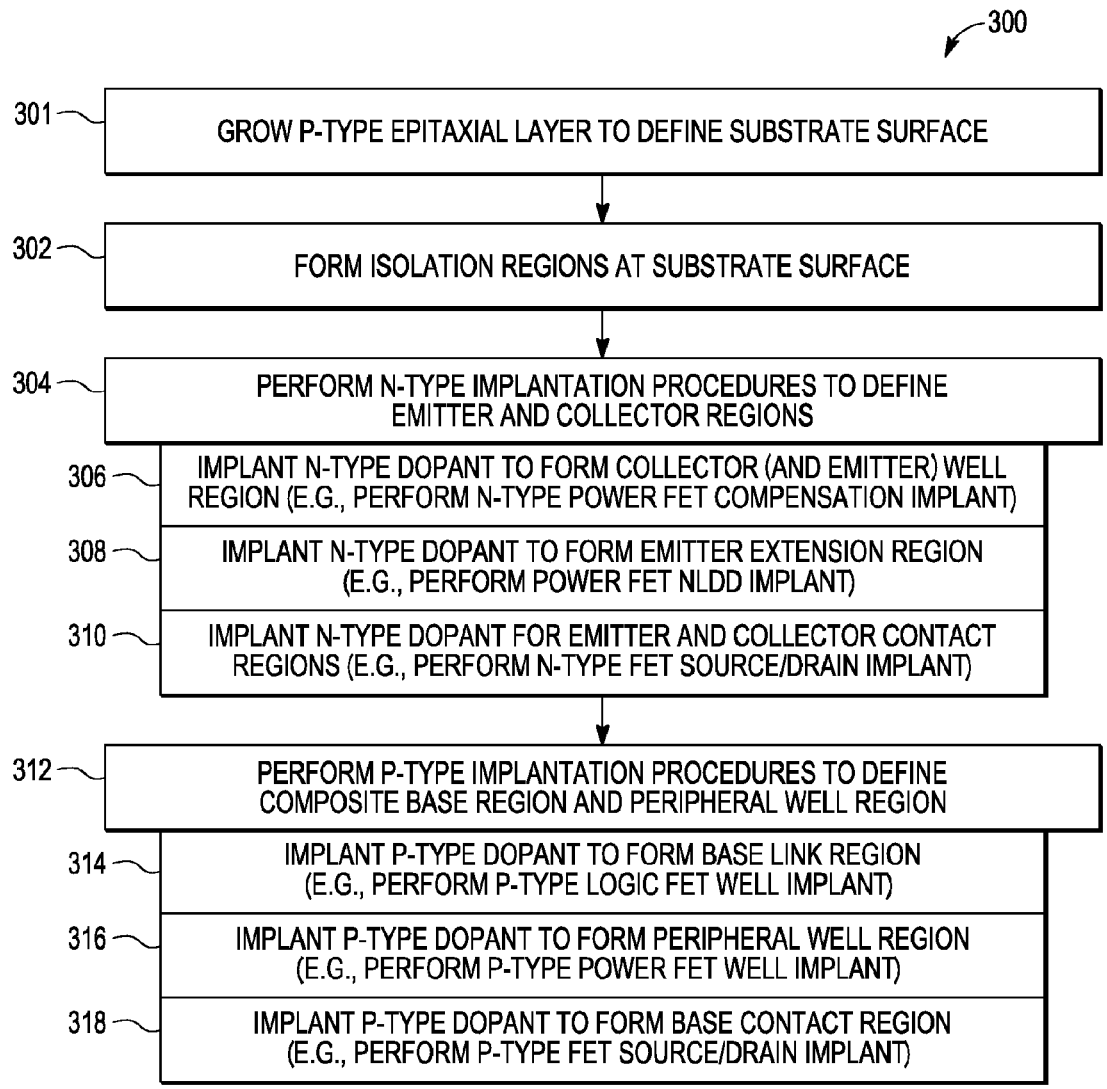
FIG. 3 is a flow diagram of an exemplary fabrication sequence to construct a bipolar transistor device having a buried conduction path in accordance with one embodiment.

FIG. 3 shows an exemplary fabrication method 300 for fabricating a lateral bipolar transistor device with a buried conduction path as described above. The transistor device is fabricated with a semiconductor substrate, the regions or layers of which may have the conductivity types of the npn transistor examples described above, or be alternatively configured to support a pnp transistor device. The method 300 includes a sequence of acts or steps, only the salient of which are depicted for convenience in illustration. The ordering of the steps may vary in other embodiments. For example, the implantation procedures may be performed in different orders.

The method 300 may begin with, or include, a step 301 in which an epitaxial layer is grown on an original substrate. The p-type epitaxial layer may have a thickness of about 3.5 µm. The growth of the epitaxial layer defines a surface of a semiconductor substrate in which the transistor device will be formed. A portion of the epitaxial layer may serve as a buried region of a composite base region as described above.

The semiconductor substrate may have an SOI construction as described above. In one example, the semiconductor substrate includes a 0.3 µm buried oxide layer disposed on a lightly doped n-type handle wafer, and a p-type epitaxial layer, e.g., about 1.5 µm, disposed on the buried oxide layer. The substrate may include an n-type or p-type handle or other original semiconductor substrate on which the insulator, epitaxial, or other layers are grown or otherwise formed. Any number of epitaxial layers may be present or grown. In some cases, the SOI construction may be provided using other procedures not involving epitaxial growth of the semiconductor layer disposed on the buried insulating layer.

In a step 302, STI regions or other isolation trenches may be formed at the surface of the semiconductor substrate. The STI regions may be formed via any now known or hereafter developed procedure. For example, step 302 may include the formation of a trench and the deposition, e.g., chemical vapor deposition (CVD), of one or more materials in the trench. In some embodiments, the trench is filled with silicon oxide. Additional or alternative materials may be deposited.

Step 302 may also include one or more procedures to define a lateral periphery of the device. Such procedures may include forming one or more DTI regions as shown in FIGS. 1 and 2. In one embodiment, the center of the deep isolation trenches may be filled with highly doped, e.g., n-type, polysilicon, which may then be surrounded by one or more dielectric layers. The width of the deep isolation trenches may be about 1.5 µm. Alternatively, such trenches may be formed via, for example, an implantation procedure that damages or otherwise changes the structure of the epitaxial layer(s). In some cases, the deep isolation trenches may be formed or defined after the formation of shallow trench isolation (STI) regions, although the order in which the trenches are formed may differ.

A plurality of implantation procedures are performed in a step 304 to implant n-type dopant to form emitter and collector regions in the epitaxial or other semiconductor layer of the substrate. The emitter and collector regions are laterally spaced from one another in the semiconductor substrate, as described above. The order of the implantation procedures may differ from the example shown. In the embodiment of FIG. 3, step 304 includes performing an implantation procedure in a step 306 to form a well of the collector region in which the collector contact region is disposed. The implantation procedure may be a power FET well implantation procedure configured to form an accumulation or other region of a power FET device, such as an LDMOS transistor device. In some cases, the implantation procedure performed in step 308 is also used to form a well of the emitter region in which the emitter contact region is disposed.

Step 304 may further include performing an implantation procedure in a step 308 to form an emitter extension region of the emitter region. The implantation procedure may be a power field-effect transistor (FET) terminal implantation procedure used to form power FET terminal extension regions, such as NLDD regions, for the source and drain regions of the power FET device, as described above.

Step 304 may further include performing an implantation procedure in a step 310 to form emitter and collector contact regions of the emitter and collector regions, respectively. The implantation procedure may be a field-effect transistor (FET) terminal implantation procedure used to form source and drain regions of power, logic, or other high or low voltage FET devices.

A plurality of implantation procedures are performed in a step 312 to implant p-type dopant to form the composite base region and any other p-type regions in the epitaxial or other semiconductor layer of the substrate. The order of the implantation procedures may vary from the example shown. The composite base region is laterally disposed between the emitter and collector regions as described above. In the embodiment of FIG. 3, step 312 includes performing an implantation procedure in a step 314 to form a base link region. The implantation procedure may be a logic FET well implantation procedure configured to form, for instance, a body or other region of a logic FET device. The base link region may be disposed laterally between the emitter and collector regions, as described above.

Step 312 further includes performing an implantation procedure in a step 316 to form a peripheral well region configured to suppress a parasitic transistor structure. The implantation procedure may be a power FET well implantation procedure configured to form a drift or other region of a power FET device.

Step 312 may further include performing a step 318 to form a base contact region. The implantation procedure may be a FET terminal implantation procedure configured to form source and drain regions of various FET devices. In some cases, the mask for the FET terminal implantation procedure provides a different opening for the implantation procedure of step 318 relative to the procedure in step 314. For example, the FET terminal implantation procedure of step 318 may have a different, e.g., wider, mask opening than the logic FET well implantation procedure of step 314.

The above-described dopant implantation procedures performed as part of steps 304 and 312 define a buried region of the composite base region. The buried region corresponds with a portion of the epitaxial or other semiconductor layer not doped by the first and second pluralities of implantation procedures. The base link region may thus have a dopant concentration level higher than the buried region. The buried region may thus support a lightly doped, buried conduction path between the emitter and collector regions during operation, as described above.

In other embodiments, the implantation procedures implemented in one or more of the above-described acts do not correspond with implantation procedures performed and configured to fabricate regions of FET devices.

Additional acts may be implemented at various points during the fabrication procedure. For example, one or more acts may be directed to defining a peripheral border of the device. One or more passivation layers and metal layers may be deposited. The steps may be implemented in various orders. Additional or alternative procedures may be implemented both before and after the steps shown in FIG. 3.

The disclosed devices may be fabricated cost effectively during a process flow configured for one or more FET device designs. The disclosed devices may be fabricated without additional masks or procedures.

In a first aspect, a device includes a semiconductor substrate, emitter and collector regions disposed in the semiconductor substrate, having a first conductivity type, and laterally spaced from one another, and a composite base region disposed in the semiconductor substrate, having a second conductivity type, and including a base contact region, a buried region through which a buried conduction path between the emitter and collector regions is formed during operation, and a base link region electrically connecting the base contact region and the buried region. The base link region has a dopant concentration level higher than the buried region and is disposed laterally between the emitter and collector regions.

In a second aspect, a device includes a semiconductor substrate having a substrate, a semiconductor layer supported by the substrate, and a buried insulator layer between the substrate and the epitaxial layer, emitter and collector regions disposed in the semiconductor layer, having a first conductivity type, and laterally spaced from one another, and a composite base region having a second conductivity type and including a base contact region disposed in the semiconductor layer, a buried portion of the semiconductor layer through which a buried conduction path between the emitter and collector regions is formed during operation, and a base link region disposed in the semiconductor layer and electrically connecting the base contact region and the buried portion of the semiconductor layer. The base link region has a dopant concentration level higher than the buried region and is disposed laterally between the emitter and collector regions.

In a third aspect, a method of fabricating a bipolar transistor device includes performing a first plurality of implantation procedures to implant dopant of a first conductivity type to form emitter and collector regions laterally spaced from one another in a semiconductor substrate, and performing a second plurality of implantation procedures to implant dopant of a second conductivity type in the semiconductor substrate to form a composite base region. The composite base region includes a base contact region, a buried region through which a buried conduction path between the emitter and collector regions is formed during operation, and a base link region electrically connecting the base contact region and the buried region. The base link region has a dopant concentration level higher than the buried region and is disposed laterally between the emitter and collector regions.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a bipolar transistor device, the method comprising:
performing a first plurality of implantation procedures to implant dopant of a first conductivity type to form emitter and collector regions laterally spaced from one another in a semiconductor substrate;
performing a second plurality of implantation procedures to implant dopant of a second conductivity type in the semiconductor substrate to form a composite base region, the composite base region comprising a base contact region, a buried region through which a buried conduction path between the emitter and collector regions is formed during operation, and a base link region electrically connecting the base contact region and the buried region; and
depositing conductive interconnects over the emitter region, collector region, and base contact region;
wherein the base link region has a dopant concentration level higher than the buried region and is disposed laterally between the emitter and collector regions, and
wherein the buried region contacts lower boundaries of the emitter region, the collector region, and the base link region.

2. The method of claim 1, wherein:
the semiconductor substrate comprises a buried insulator layer and a semiconductor layer disposed on the buried insulator layer;
the emitter, collector, and base link regions are disposed in the semiconductor layer; and
the buried region corresponds with a portion of the semiconductor layer not doped by the first and second pluralities of implantation procedures.

3. The method of claim 1, wherein a field-effect transistor (FET) terminal implantation procedure of the first plurality of implantation procedures is configured to form emitter and collector contact regions of the emitter and collector regions, respectively.

4. The method of claim 3, wherein a power FET well implantation procedure of the first plurality of implantation procedures is configured to form a well of the collector region in which the collector contact region is disposed.

5. The method of claim 4, wherein the power FET well implantation procedure is further configured to form a well of the emitter region in which the emitter contact region is disposed.

6. The method of claim 1, wherein a logic FET well implantation procedure of the second plurality of implantation procedures is configured to form the base link region.

7. The method of claim 6, wherein:
a FET terminal implantation procedure of the second plurality of implantation procedures is configured to form the base contact region; and
the FET terminal implantation procedure has a different mask opening than the logic FET well implantation procedure.

8. The method of claim 1, wherein the first and second pluralities of implantation procedures are configured such that the base link region has a deeper lower boundary than the emitter and collector regions.

9. The method of claim 1, wherein the second plurality of implantation procedures are configured such that the buried conduction path extends across an entire lateral extent of the base link region.

10. The method of claim 1, wherein:
the first plurality of implantation procedures are configured to form an emitter contact region and a collector contact region of the emitter and collector regions, respectively; and
the method further comprises forming a first shallow trench isolation (STI) region disposed between the emitter contact region and the base contact region and a second STI region disposed between the base contact region and the collector contact region.

11. The method of claim 1, further comprising growing an epitaxial layer of the semiconductor substrate in which the emitter and collector regions are formed by the first plurality of implantation procedures.

12. A method of fabricating a bipolar transistor device, the method comprising:
performing a first plurality of implantation procedures to implant dopant of a first conductivity type to form emitter and collector regions laterally spaced from one another in a semiconductor substrate;
performing a second plurality of implantation procedures to implant dopant of a second conductivity type in the semiconductor substrate to form a composite base region, the composite base region comprising a base contact region, a buried region through which a buried conduction path between the emitter and collector regions is formed during operation, and a base link region electrically connecting the base contact region and the buried region; and
depositing conductive interconnects over the emitter region, collector region, and base contact region
wherein the base link region has a dopant concentration level higher than the buried region and is disposed laterally between the emitter and collector regions, and
wherein the buried region corresponds with a portion of the semiconductor substrate not doped by the first and second pluralities of implantation procedures, and
wherein the buried region contacts lower boundaries of the emitter region, the collector region, and the base link region.

13. The method of claim 12, wherein:
a field-effect transistor (FET) terminal implantation procedure of the first plurality of implantation procedures is configured to form emitter and collector contact regions of the emitter and collector regions, respectively; and
a power FET well implantation procedure of the first plurality of implantation procedures is configured to form a well of the collector region in which the collector contact region is disposed.

14. The method of claim 13, wherein the power FET well implantation procedure is further configured to form a well of the emitter region in which the emitter contact region is disposed.

15. The method of claim 12, wherein a logic FET well implantation procedure of the second plurality of implantation procedures is configured to form the base link region.

16. The method of claim 15, wherein:
a FET terminal implantation procedure of the second plurality of implantation procedures is configured to form the base contact region; and
the FET terminal implantation procedure has a different mask opening than the logic FET well implantation procedure.

17. A method of fabricating a bipolar transistor device, the method comprising:

performing a first plurality of implantation procedures to implant dopant of a first conductivity type to form emitter and collector regions laterally spaced from one another in a semiconductor substrate;

performing a second plurality of implantation procedures to implant dopant of a second conductivity type in the semiconductor substrate to form a composite base region, the composite base region comprising a base contact region, a buried region through which a buried conduction path between the emitter and collector regions is formed during operation, and a base link region electrically connecting the base contact region and the buried region; and depositing conductive interconnects over the emitter region, collector region, and base contact region wherein the base link region has a dopant concentration level higher than the buried region and is disposed laterally between the emitter and collector regions, wherein the second plurality of implantation procedures comprise a logic FET well implantation procedure, and the logic FET well implantation procedure is configured to form the base link region, and wherein the buried region contacts lower boundaries of the emitter region, the collector region, and the base link region.

18. The method of claim 17, wherein:

a field-effect transistor (FET) terminal implantation procedure of the first plurality of implantation procedures is configured to form emitter and collector contact regions of the emitter and collector regions, respectively; and a power FET well implantation procedure of the first plurality of implantation procedures is configured to form a well of the collector region in which the collector contact region is disposed.

19. The method of claim 18, wherein the power FET well implantation procedure is further configured to form a well of the emitter region in which the emitter contact region is disposed.

20. The method of claim 19, wherein:

a FET terminal implantation procedure of the second plurality of implantation procedures is configured to form the base contact region; and the FET terminal implantation procedure has a different mask opening than the logic FET well implantation procedure.

* * * * *